United States Patent
Chadwick

(10) Patent No.: US 6,809,585 B2
(45) Date of Patent: Oct. 26, 2004

(54) FREQUENCY MODULATION SYSTEM AND METHOD

(75) Inventor: Peter Edward Chadwick, Swindon (GB)

(73) Assignee: Zarlink Semiconductor Limited, Wiltshire (GB)

( * ) Notice: Subject to any disclaimer, the term of this patent is extended or adjusted under 35 U.S.C. 154(b) by 0 days.

(21) Appl. No.: 10/449,746

(22) Filed: May 30, 2003

(65) Prior Publication Data
US 2003/0227331 A1 Dec. 11, 2003

(30) Foreign Application Priority Data
May 31, 2002 (GB) .............................................. 0212727

(51) Int. Cl.[7] .............................................. H03D 3/02
(52) U.S. Cl. .................... 329/325; 360/30; 455/208; 455/337
(58) Field of Search ................................ 329/315, 323, 329/325; 455/205, 208, 214, 337; 360/30, 51

(56) References Cited

U.S. PATENT DOCUMENTS

| 4,110,707 A | 8/1978 | Giolma et al. |
| 4,688,003 A | 8/1987 | Stromswold |
| 5,408,195 A * | 4/1995 | Miyazaki ..................... 329/325 |

FOREIGN PATENT DOCUMENTS

| GB | 2233844 A | 1/1991 |
| GB | 0212727.2 | 7/2000 |
| WO | WO 81/03250 | 11/1981 |

* cited by examiner

Primary Examiner—David Mis
(74) Attorney, Agent, or Firm—Dority & Manning, P.C.

(57) ABSTRACT

A frequency modulation system is disclosed which includes a voltage-controlled oscillator (VCO) 43 and a phase detector 47 configured to receive an output signal from the VCO. The phase detector is arranged to output an error signal representing the phase difference between the signal from the VCO and a reference signal. The system also includes control means 62 arranged to monitor the error signal to derive an indication of the frequency deviation of the VCO, and, in accordance with this derivation, to maintain the frequency deviation of the VCO substantially constant.

13 Claims, 5 Drawing Sheets

FREQUENCY MODULATION SYSTEM AND METHOD

CROSS-REFERENCE TO RELATED APPLICATIONS

The present application claims priority to currently pending United Kingdom Patent Application number 0212727.2, filed on May 31, 2002.

STATEMENT REGARDING FEDERALLY SPONSORED RESEARCH OR DEVELOPMENT

N/A

BACKGROUND OF THE INVENTION

Frequency modulation (FM) and phase modulation (PM) techniques are used for transmitting information on a carrier signal, e.g. sound information on a carrier radio wave. Unlike amplitude modulation techniques (AM) where the amplitude of a carrier signal is modulated by the information signal, in FM and PM, the frequency and phase of the carrier signal, respectively, is modulated. FM and PM are usually referred to collectively as 'angle modulation' techniques. In this description, although the term frequency modulation, or FM, is used throughout, it should be understood that the term is intended to apply equally to PM techniques.

As will be appreciated by those skilled in the art, a quality measure for FM modulation systems is the 'modulation index', which is defined as the ratio of the frequency deviation during modulation to the modulating frequency. Certain applications require a high modulation index, whilst others require a low modulation index. In applications where a high modulation index accuracy is desirable, such as in a radio system, a number of circuit arrangements can be used.

Referring to FIG. 1, a known FM circuit employs the well known I (in-phase) and Q (quadrature) modulation scheme. First and second modulating inputs 3, 5 are provided for receiving an input signal in phase quadrature. The signals are applied to first and second balanced modulators 7, 9 that receive, on first and second lines 10, 11 a quadrature input from a quadrature phase shift network 13. The quadrature input is received at the signal frequency in accordance with the operation of a carrier frequency source 15. The outputs from the first and second modulators 7, 9 are passed, on respective lines 17, 19, to a summing circuit 21. The summed output is provided on output line 23.

Modulation circuits such as that shown in FIG. 1 are used widely and are able to produce almost any form of modulation, albeit with some limitations in frequency shift keying (FSK) modulation. However, the provision of the two balanced modulators 7, 9 with accurate balance of gain and phase, and the provision of the phase shift network 13, results in a complex circuit that requires relatively high power.

A simplified system is shown in FIG. 2. Here, a voltage-controlled oscillator (VCO) 27 feeds a frequency divider 29, usually implemented as a digital counter. The output from the divider 29 provides one input to a phase detector 31, the other input being taken from a reference frequency source 33. The phase detector 31 outputs an error signal representing the phase difference between the two input signals. This error signal is fed to a low pass filter 35 and then to a summing circuit 37 that is fed back to a control input of the VCO 27. A modulation signal is applied from a supply means 39 to a further input of the summing circuit 37. The VCO 27 is directly modulated by the summation result, and the modulated output is taken as the output from the VCO. The loop bandwidth of the circuit of FIG. 2 is determined by a number of factors, and the modulation frequency or frequencies may be totally inside or outside of the bandwidth, or even partially inside and outside the bandwidth.

Systems such as that shown in FIG. 2 have been in use for many years. They offer the advantage that complexity is minimized, and the component count is reduced so that power consumption can be kept at a minimum. The general layout of the circuit components of FIG. 2 will be recognized as being similar to a phase locked loop (PLL) and the bandwidth of the loop is chosen such that the modulation frequency lies outside the bandwidth. In many systems this is because the channel spacing requirements are such that in order to achieve adequate suppression of reference frequency components at the VCO, it is impractical if the attenuation curve of the low pass filter does not start at a low value. A general problem with such systems is that the frequency deviation needs to be set for each different modulation system on an individual basis because of the difficulties in producing a VCO in which the control voltage coefficient Kv (controlling the frequency change in Hertz per volt) is constant within a single production batch. Further problems appear since the value of Kv varies with supply voltage and/or temperature.

OBJECTS AND SUMMARY OF THE INVENTION

The invention, in one sense, relates to a system for performing frequency modulation which includes a VCO and a phase detector configured to receive an output signal from the VCO, the phase detector being arranged to output an error signal representing the phase difference between the signal output from the VCO and a reference signal, the system also including control means arranged to monitor the error signal to derive an indication of the frequency deviation and, as a result of the derivation, to maintain the frequency deviation of the VCO substantially constant. In the context of the application, 'VCO' is intended to mean any circuit or system whereby the frequency of an output voltage from the circuit or system is dependent on a voltage (often referred to as a 'control voltage') inputted therein.

According to a further aspect of the present invention, there is provided a frequency modulation system comprising: a VCO; means for summing a modulating input signal and an error signal thereby to generate a signal for controlling the frequency of a signal outputted from the VCO; a phase detector for generating the error signal based on the detected phase difference between the signal outputted from the VCO and a reference signal; and control means arranged (a) to receive the error signal and to derive an indication of the frequency deviation of the VCO; and (b) to vary the output from the summing means in accordance with the frequency deviation thereby to maintain the frequency deviation of the VCO substantially constant.

The system may further include a controllable gain module arranged to output, to the summing means, an amplified version of the modulating input signal, the control means being arranged to vary the output from the summing means by controlling the amount of amplification applied to the modulating input signal.

The control means may be arranged to generate, from the error signal, a signal representative of the frequency deviation of the VCO, and to generate a gain signal for controlling the gain applied by the controllable gain module.

The control means may include means arranged to determine the amplitude of the error signal, and comparator means arranged to compare the determined amplitude with a predetermined reference voltage, the output from the comparator means comprising the gain signal for controlling the gain of the controllable gain module.

The amplitude determining means comprises a rectifier. In digital modulation applications, the amplitude determining means may include a sample and hold circuit. The system may further comprise a frequency divider connected between the VCO and the phase detector.

According to a further aspect of the invention, there is provided a frequency modulation system comprising: a VCO; means for summing a modulating input signal and an error signal thereby to generate a signal for controlling the frequency of a signal outputted from the VCO; a phase detector for generating the error signal based on the detected phase difference between the signal outputted from the VCO and a fixed frequency reference signal; and control means arranged (a) to receive the error signal and to derive a controlling signal that is proportional to the frequency deviation of the VCO, and (b) to vary the output from the summing means, using the controlling signal, thereby to maintain the frequency deviation substantially constant.

According to further aspect of the invention, there is provided a method of performing frequency modulation in a system comprising a VCO, means for summing a modulating input signal and an error signal thereby to generate a signal for controlling the frequency of a signal outputted from the VCO, and a phase detector for generating the error signal based on the detected phase difference between the signal outputted from the VCO and a reference signal, wherein the method comprises: monitoring the error signal and deriving an estimate of the frequency deviation exhibited by the VCO; and controlling the output of the summing means in accordance with the estimated frequency deviation such that the frequency deviation of the VCO is maintained substantially constant.

While the above-mentioned FM systems and methods can be used in radio system applications, the same also applies to optical system applications.

Additional objects and advantages of the invention will be set forth in part in the description that follows, and in part will be obvious from the description, or may be learned by practice of the invention. The objects and advantages of the invention may be realized and attained by means of the instrumentalities and combinations particularly pointed out in the appended claims.

The accompanying drawings, which are incorporated in and constitute a part of this specification, illustrate at least one presently preferred embodiment of the invention as well as some alternative embodiments. These drawings, together with the description, serve to explain the principles of the invention but by no means are intended to be exhaustive of all of the possible manifestations of the invention.

DETAILED DESCRIPTION OF THE PREFERRED EMBODIMENTS

Reference now will be made in detail to the presently preferred embodiments of the invention, one or more examples of which are illustrated in the accompanying drawings. Each example is provided by way of explanation of the invention, which is not restricted to the specifics of the examples. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents. The same numerals are assigned to the same components throughout the drawings and description.

As mentioned above, although the following description refers to a FM system, it should be remembered that such references are intended to cover PM systems also.

Figure 3:
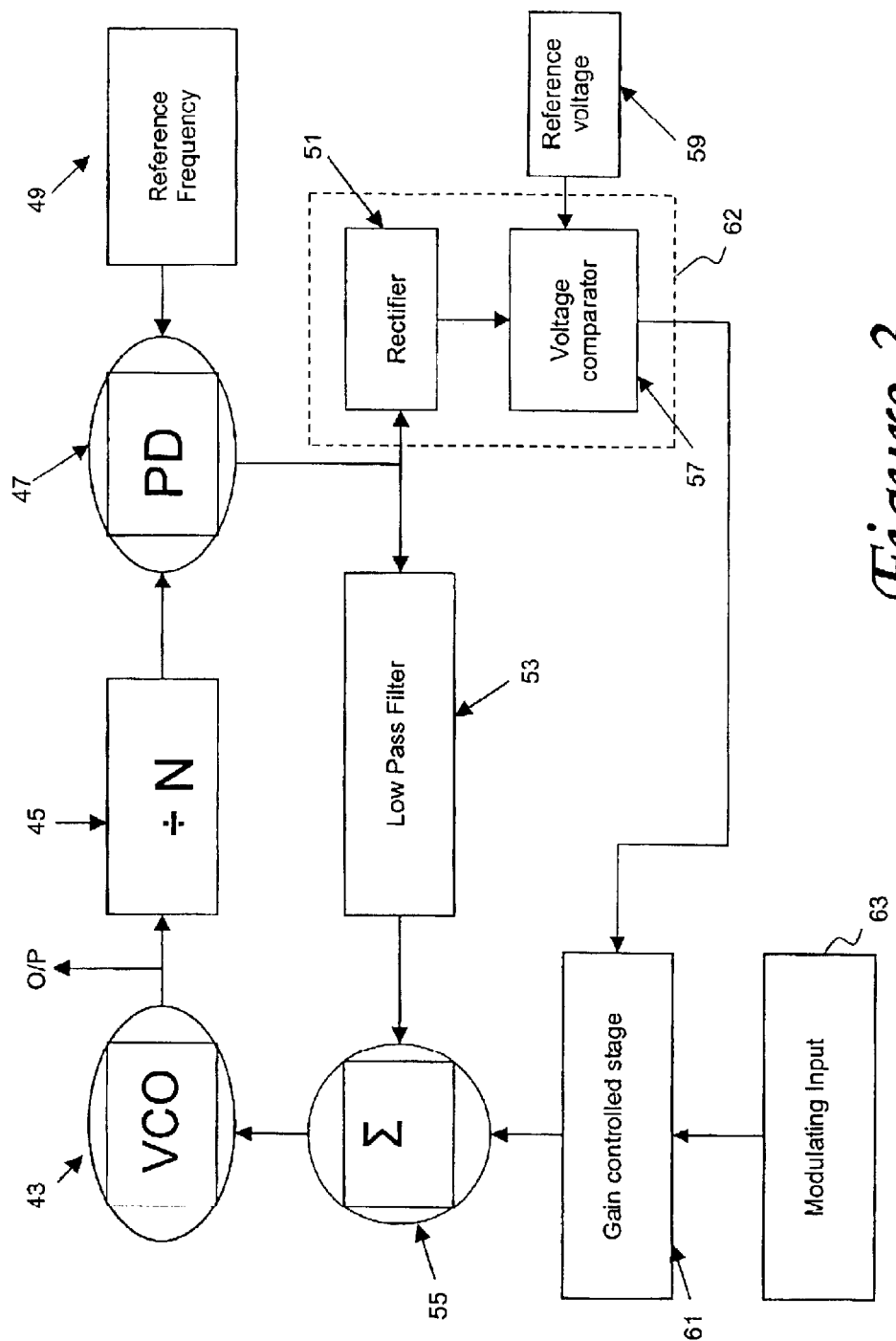
FIG. 3 is a schematic circuit diagram of a FM system in accordance with a first preferred embodiment of the invention.

Referring to FIG. 3, in a first preferred embodiment, a system for frequency modulating a signal comprises a VCO 43 that is connected to a frequency divider 45, which can be implemented as a digital counter. The frequency divider 45 is itself connected to a phase detector 47. The phase detector 47 also receives a reference frequency signal from a reference source 49 and generates an output signal in the form of a voltage level representing the instantaneous phase error between (a) the signal received from the VCO 43 via the divider 45, and (b) the reference frequency. The error signal is passed to a low pass filter 53 and to a rectifier 51, which rectifier forms part of a gain control circuit 62, as will be explained below. The low pass filter 53 is connected to an adder 55, the output of which is connected to the control input of the VCO 43. As will be appreciated, the output frequency of the VCO 43 will be dependent on the control voltage. A modulating input source 63 provides the required modulating input signal. The modulating input signal is input to an input of the adder 55 by means of a gain controlled stage 61. The FM output signal is taken from the output of the VCO 43.

As briefly mentioned above, a gain control circuit 62 is provided. The purpose of the gain control circuit 62 is to modify the gain controlled stage 61 so as to maintain the modulation index at a substantially constant Fig. Since the modulated VCO signal appears at the input to the phase detector 47, it is noted that the outputted error signal from the phase detector contains a small a.c. component that is proportional to the frequency deviation of the VCO 43. Since the modulation index is dependent on the frequency deviation, this error signal can be used to control subsequent stages of the system to maintain modulation index accuracy. It is comparatively easy to produce the phase detector 47 with a known transfer characteristic K☐ (radians/volt). Accordingly, an accurate measure of the frequency deviation is given by the magnitude of the alternating voltage contained in the error signal from the phase detector 47. Given the circuit arrangement already discussed, it will be clear that the amplitude of the modulating signal from the modulating input 63, and thus the frequency deviation of the VCO 43, is determined by the gain controlled stage 61. Therefore, by controlling the gain-controlled stage 61 in accordance with the amplitude of the a.c. component in the error signal, the modulation index can be kept substantially constant.

The gain control circuit 62 comprises the rectifier 51, which is connected to a voltage comparator 57. The voltage comparator 57 also receives a reference voltage 59. The output of the voltage comparator 57 is fed to the gain controlled stage 61. The a.c. component of the error signal from the phase detector 47 is rectified by the rectifier 51, and applied to the voltage comparator 57 wherein the voltage is compared with the reference voltage 59. The output from the voltage comparator 57 is fed to the gain controlled stage 61 so as to maintain the frequency deviation caused by modulation of the VCO 43 constant. Note that, in practice, integrating capacitors (not shown) would be associated with the rectifier and a low pass filter (not shown) would be provided between the comparator 57 and the gain-controlled stage 61.

Figure 4:
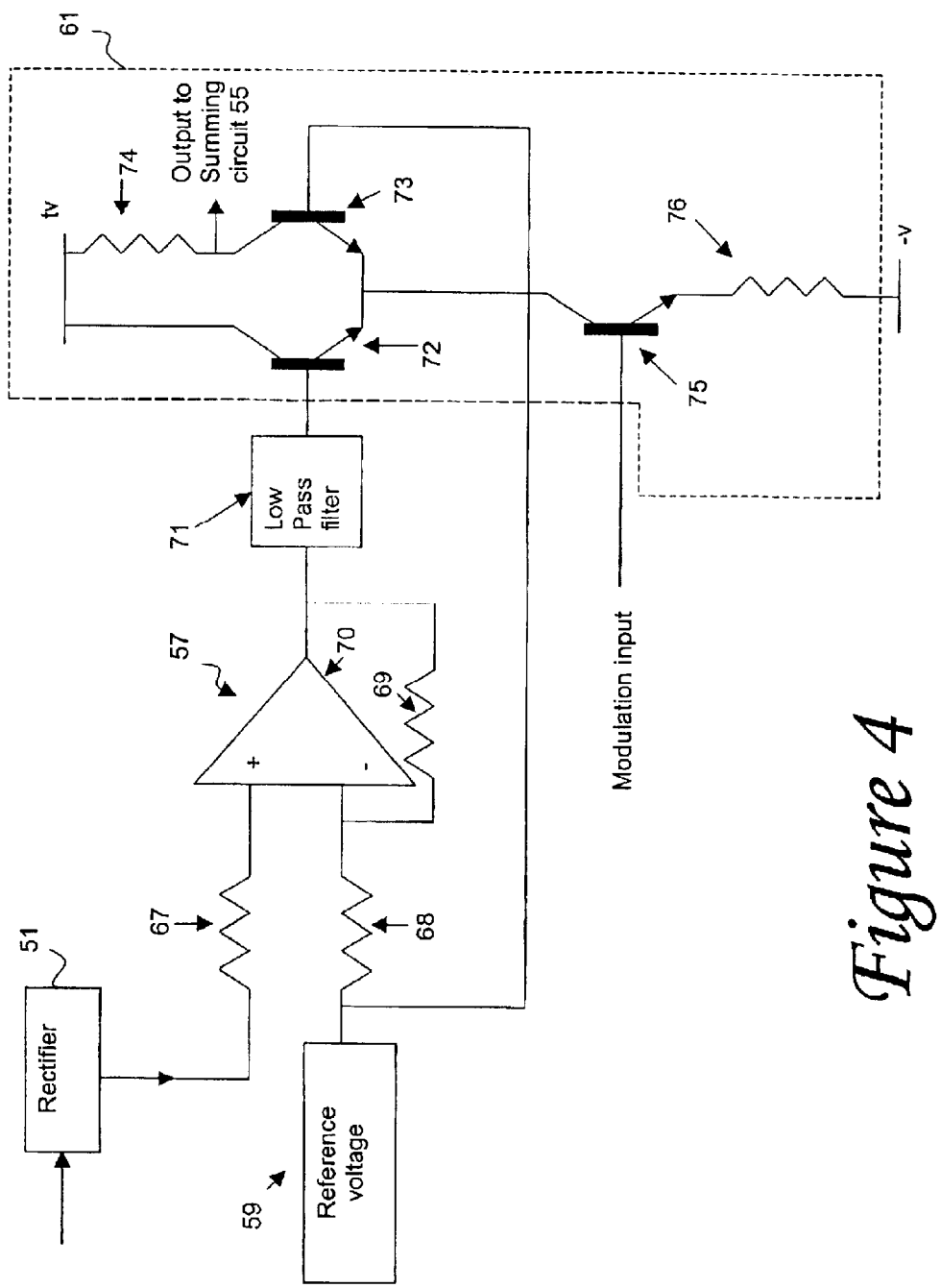
FIG. 4 is a circuit diagram showing part of the FM system shown in FIG. 3.

Reference is made to FIG. 4, which shows a circuit-level implementation of the gain control circuit 62 and the gain controlled stage 61. An operational amplifier 70 forms the basis of the voltage comparator 57. The output from the rectifier 51 (which may include integrating capacitors, if necessary) is connected to the non-inverting input of the operational amplifier 70 by means of a first resistor 67. The inverting input of the operational amplifier 70 is connected, by means of a second resistor 68, to the reference voltage source 59. A feedback resistor 69 is connected between the inverting input and the output of the operational amplifier 70, and as will be understood, the ratio of the feedback resistor and the second resistor 68 set the gain of the operational amplifier. The output of the operational amplifier 70 is connected to a low-pass filter 71, the output of which is connected to one input of a differential amplifier stage. The differential amplifier stage forms part of the gain controlled stage 61. The differential amplifier stage comprises first and second transistors 72, 73 connected in a long-tailed pair arrangement. The output of the low-pass filter 71 is connected to the first transistor 72. The base terminal of the second transistor 73 of the long-tailed pair arrangement is connected to the constant reference voltage source 59. A tail transistor 75 receives, at its base terminal, the modulating input from the modulating input source 63. A third resistor 76, which can be provided to allow for level shifting, is connected between the emitter terminal of the tail transistor 75 and a negative supply line, although as an alternative, a grounded line could be used.

By varying the voltage at the base terminal of the first transistor 72 (whilst the voltage at the base terminal of the second transistor 73 is held constant) the collector current of the tail transistor 75 is diverted either through a load resistor 74 (connected between a positive supply line and the collector terminal of the second transistor 73) or through the collector terminal of the first transistor 72, which is connected to the positive supply line. Thus, a variable gain circuit is achieved. The output from the collector terminal of the second transistor 73 provides the output signal to the adder 55. In practice, means would be provided to prevent a d.c. level shift occurring when a change in gain occurs.

Other circuit arrangements for varying the amplitude of the modulating input signal will be known to those skilled in the art.

It will be clear to those skilled in the art that variations in the value of N (the amount by which the frequency is divided in the frequency divider 45), required when the frequency of the VCO 43 is changed for purposes such as the selection of another operating frequency, will cause changes in the frequency deviation. This may be accommodated either by providing an allowable tolerance on the deviation for those cases where the change in N is small, or by alteration of the reference voltage, from the reference voltage source 59, in sympathy with the changing value of N. Alternatively, this can be achieved by controlling the gain of the gain-controlled stage 61 in sympathy with the value of N programmed in the frequency divider 45.

Although the embodiment shown in FIG. 3 comprises a simple frequency divider 45, the same function may be achieved in a number of alternative ways. For example, a two modulus divider could be used, as could part of a fractional N divider. Both types of divider are well known in the art.

Figure 5:
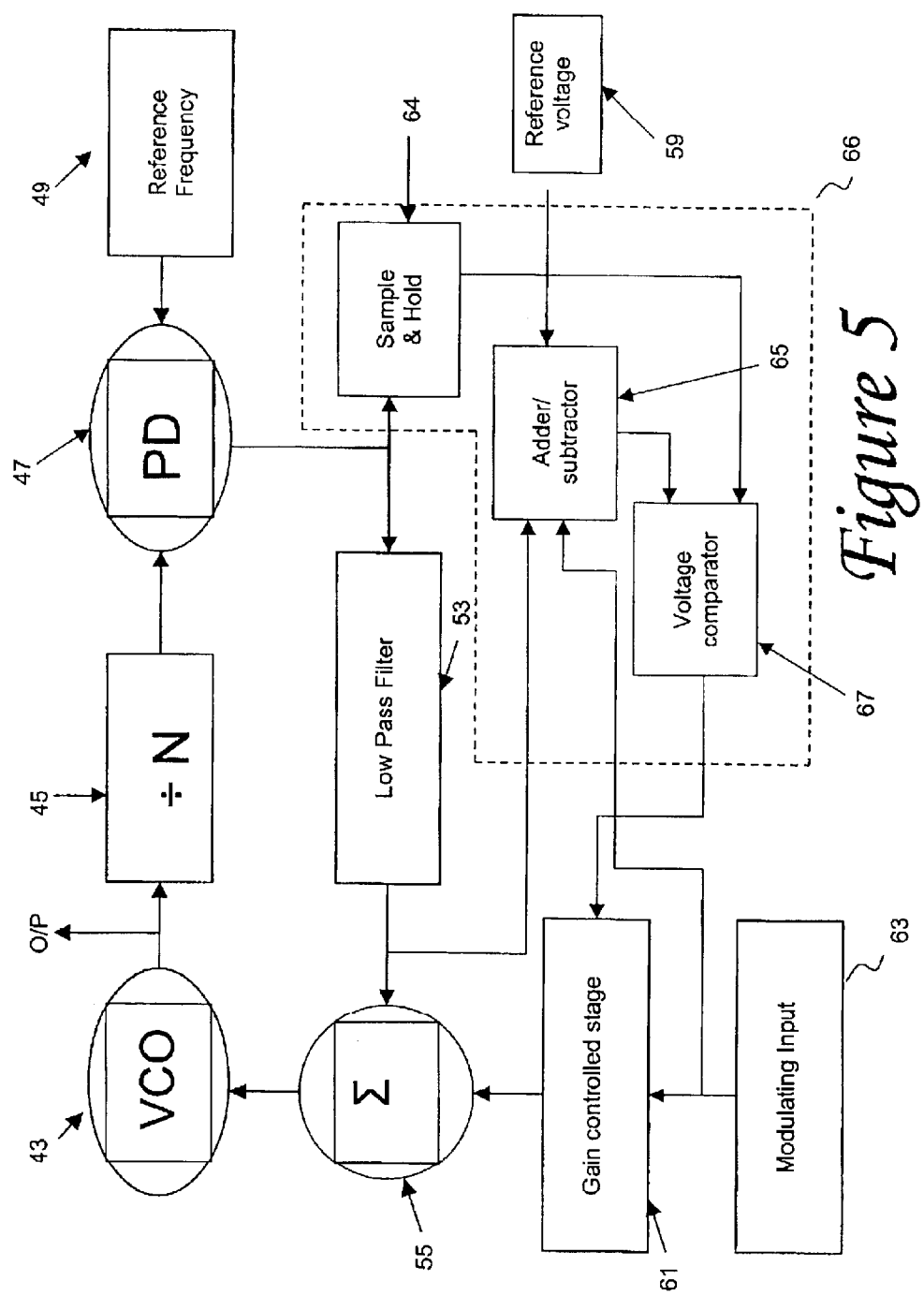
FIG. 5 is a schematic circuit diagram of a FM system in accordance with a second preferred embodiment of the invention.

Referring now to FIG. 5, a second preferred frequency modulating system is shown. The system is the same as that shown in FIG. 3, except that a different gain control circuit 66 is shown. The gain control circuit 66 comprises a sample and hold circuit 64 which is connected to a voltage comparator 67. The reference voltage source 59 supplies the reference voltage to an adder/subtractor 65. The adder/subtractor 65 is also connected to the output of the low pass filter 53 and to the modulating input 65. The output from the adder/subtractor 65 is passed to a further input of the voltage comparator 67. The output from the voltage comparator 67 is connected to the gain controlled stage 61.

The second preferred form of system shown in FIG. 5 is advantageous where the modulation is of digital form, such as in two-level FSK modulation (2-FSK). However, the system is not limited to such digital modulation schemes and can be used with analogue modulation schemes.

In the second embodiment shown in FIG. 5, the output from the sample and hold circuit 64 will be greater or less than the average voltage at the output of the low pass filter 53, the difference being dependent upon whether the modulating signal is a '1' or a '0' and the polarity of the signals transmitted, i.e. if the transmission of a '1' is determined by a frequency that is higher or lower than the center frequency. The magnitude of the difference will be dependent on the amount of phase deviation at the input of the phase detector 47. The signal that is fed to the voltage comparator 67, which may be similar to that described for the previous embodiment, is derived by summing the average value of the control voltage of the VCO 43 with a signal to either increase or decrease the result of the summation in sympathy with the modulating signal. The magnitude of such increase or decrease is determined by the value of the reference voltage from the reference voltage source 59. The output from the adder/subtractor 65 thus varies in sympathy with the modulating input signal, with the variation in level being fixed by the value of the reference voltage and the absolute value being fixed by the average value of the control voltage applied to the VCO 43. The absolute value of the signal at the output of the sample and hold circuit 64 will be dependent both upon the modulation value (i.e. a '1' or a '0') and the control voltage applied to the VCO 43. Thus, both signals applied to the voltage comparator 67 will vary together, and, provided delays in the VCO 43, the divider 45, and the phase detector 47, the output of the voltage comparator 67 will be such as to enable the gain controlled stage 61 to vary the level of modulating signal such that the deviation of the VCO with modulation is automatically controlled to a given level, preset by the value of the reference voltage from the reference voltage source 59.

It will be noted that the rectifier 51 used in the circuit of FIG. 3 is replaced by the sample and hold circuit 65. By sampling the amplitude of the error signal, outputted from the phase detector 47, at a suitable symbol rate that is synchronous with the digital modulation signal, the instantaneous voltage present at the output of the phase detector represents the instantaneous frequency of the VCO 43 (albeit delayed by the propagation delay of the frequency divider 45, a delay which can be readily compensated for by well known techniques). The absolute value of this sampled voltage depends on the operating frequency, and depending on whether a "1" or "0" is to be transmitted, will be above or below the average value of the control voltage. The adder/subtractor 65 therefore adds the transmitted "1" or "0" or vice versa. The addition and subtraction function is controlled by the transmitted data and the output of the adder/subtractor 65 then accurately represents the required voltage at the VCO 43. The output of the phase detector 47 is sampled at the modulation bit-rate by the sample and hold circuit 65, and the voltage compared with that at the output of the adder/subtractor 65 in the voltage comparator 67 so as to vary the gain of the gain controlled stage 61 to maintain the frequency deviation at the required level.

Where the modulation is of multiple levels, such as in M-level FSK, the reference voltage may be varied in sympathy with the modulation to produce the necessary number of levels and so a required, substantially constant, modulation index.

In the systems shown in FIGS. 3 and 5, the gain controlled stage 61 may be implemented as a variable gain amplifier, the gain being adjusted in accordance with the gain control circuit 62, 66 of the respective systems.

As will be appreciated, the reference voltage of the gain control circuit 62, 66 can be adjusted in order to control the modulation index. Indeed, either the gain of the gain controlled stage 61, or the reference voltage from the reference voltage source 59, can be controlled in sympathy with the programmed frequency to maintain a substantially constant modulation index. In this context, "programmed frequency" takes its usual meaning in relation to frequency synthesizers, i.e. it is that VCO frequency produced by the programming of any particular number N in the divider, i.e. the divider 45, in this case.

Figure 1:
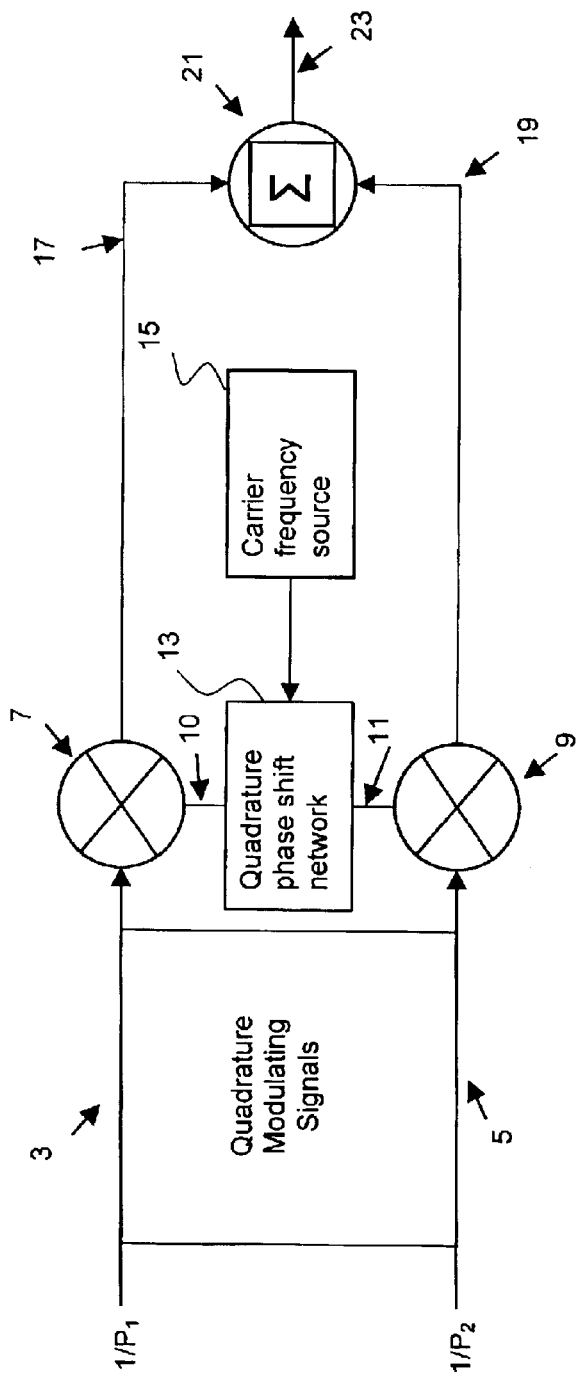
FIG. 1 is a schematic circuit diagram of a known FM system that is useful for understanding the invention.
Figure 2:
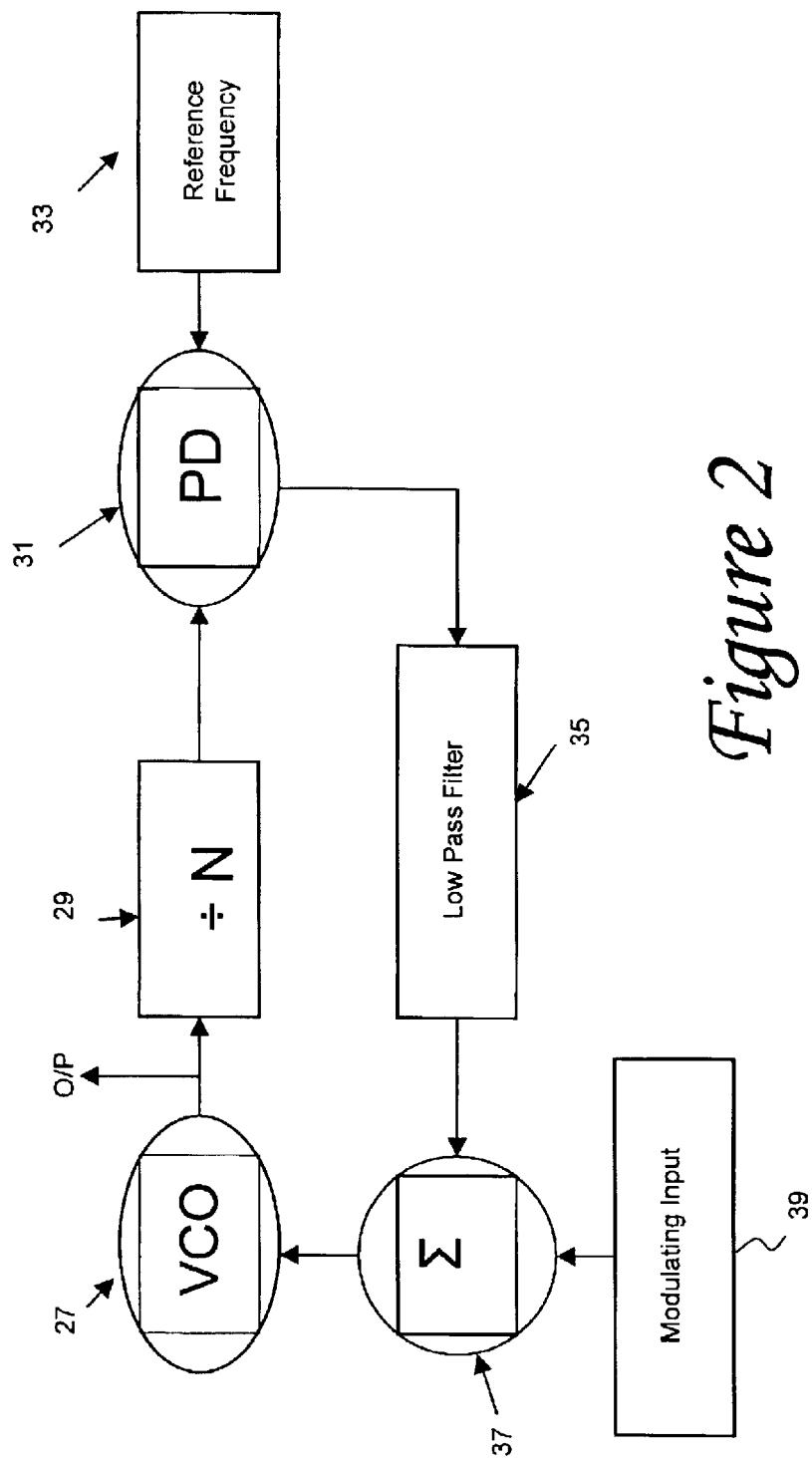
FIG. 2 is a schematic circuit diagram of a further, known FM system, which is useful for understanding the invention.

It will be appreciated that the general configuration of the modulation systems shown in FIGS. 1 and 2 is similar to that of a PLL.

The above two systems enable accurate control of the frequency deviation exhibited by the VCO and so allow the modulation index to be maintained substantially constant. This is performed in such a way that the modulation index is independent of variations in the value of Kv, i.e. the control voltage coefficient of the VCO 43.

While at least one presently preferred embodiment of the invention has been described using specific terms, such description is for illustrative purposes only, and it is to be understood that changes and variations may be made without departing from the spirit or scope of the following claims.

What is claimed is:

1. A frequency modulation system comprising:
   a voltage controlled oscillator (VCO),
   a phase detector,
   a reference source, and
   a control circuit
   wherein the phase detector produces an error signal output representing the phase difference between an output signal from the VCO and the reference source and wherein the control circuit monitors the error signal (a) to derive an indication of the frequency deviation of the VCO, and, in accordance with the derivation, (b) to maintain the frequency deviation of the VCO substantially constant.

2. A frequency modulation system according to claim 1, wherein the system is applied to a radio or optical system.

3. A frequency modulation system comprising:
   a voltage controlled oscillator (VCO) producing an output signal,
   a reference signal source producing a reference signal,
   a phase detector producing an output error signal based on the phase difference between the output signal from the VCO and the reference signal from the reference signal source,
   a modulation signal source,
   an adder combining a signal from the modulation signal source and the error signal from the phase detector to generate a signal for controlling the frequency of the output signal from the VCO, and
   a control circuit configured (a) to receive the error signal from the phase detector and to derive an indication of the frequency deviation of the VCO; and (b) to vary the output from the adder in accordance with the derived frequency deviation thereby to maintain the frequency deviation of the VCO substantially constant.

4. A system according to claim 3, further including:
   a controllable gain circuit configured to output to the adder an amplified version of the modulating input signal, the control circuit being arranged to vary the output from the adder by controlling the amount of amplification applied to the modulating input signal.

5. A system according to claim 4, wherein the control circuit is configured to generate, based on the error signal, a signal representative of the frequency deviation of the VCO, and to generate a gain control signal for controlling the gain applied by the controllable gain circuit.

6. A system according to claim 5, wherein the control circuit is configured to determine the amplitude of the error signal, and further includes a comparator for comparing the determined amplitude with a reference voltage, the output from the comparator comprising the gain control signal for controlling the gain of the controllable gain circuit.

7. A system according to claim 6, wherein the control circuit is configured to vary the reference voltage to control the gain of the controllable gain circuit.

8. A system according to claim 7, wherein the amplitude of the error signal is determined by a rectifier.

9. A system according to claim 6, wherein the amplitude of the error signal is determined by a sample and hold circuit.

10. A system according to claim 3, further comprising a frequency divider connected between the VCO and the phase detector.

11. A frequency modulation system according to claim 2, wherein the system is applied to a radio or optical system.

12. A frequency modulation system comprising:
    a voltage controlled oscillator (VCO),
    a phase detector for generating an error signal based on the detected phase difference between the output signal from the VCO and a fixed frequency reference signal,
    an adder for summing a modulating input signal and the error signal to generate a signal for controlling the output frequency of the VCO, and control means configured (a) to receive the error signal and to derive a controlling signal that is proportional to the frequency deviation of the VCO, and (b) to vary the output from the summing means, using the controlling signal, to maintain the frequency deviation of the VCO substantially constant.

13. A method for performing frequency modulation in a system including a voltage controlled oscillator (VCO), a phase detector for generating an error signal based on the detected phase difference between an output signal from the VCO and a reference signal, and means for summing a modulating input signal and the error signal to generate a signal for controlling the output frequency of the VCO, the method comprising the steps of:

monitoring the error signal and deriving therefrom an estimate of the frequency deviation exhibited by the VCO, and controlling the output of the summing means in accordance with the estimated frequency deviation such that the frequency deviation of the VCO is maintained substantially constant.

* * * * *